United States Patent
Han et al.

(10) Patent No.: US 7,323,939 B2
(45) Date of Patent: Jan. 29, 2008

(54) LOW NOISE AMPLIFIER FOR WIDEBAND TUNABLE MATCHING

(75) Inventors: Seon-Ho Han, Daejon (KR); Mun-Yang Park, Daejon (KR); Hyun-Kyu Yu, Daejon (KR)

(73) Assignee: Electronics and Telecommunications Research Institute (KR)

( * ) Notice: Subject to any disclaimer, the term of this patent is extended or adjusted under 35 U.S.C. 154(b) by 134 days.

(21) Appl. No.: 11/241,128

(22) Filed: Sep. 29, 2005

(65) Prior Publication Data

US 2006/0132242 A1  Jun. 22, 2006

(30) Foreign Application Priority Data

Dec. 21, 2004  (KR) .................. 10-2004-0109407

(51) Int. Cl.
*H03F 3/04* (2006.01)
(52) U.S. Cl. .................. 330/311; 330/305; 330/98
(58) Field of Classification Search ............... 330/277, 330/311, 98, 305
See application file for complete search history.

(56) References Cited

U.S. PATENT DOCUMENTS

| | | | |
|---|---|---|---|
| 6,118,989 A | | 9/2000 | Abe et al. |
| 6,731,175 B1 * | | 5/2004 | Chen .................. 330/311 |
| 6,768,377 B2 | | 7/2004 | Macedo |
| 7,154,330 B2 * | | 12/2006 | Quek .................. 330/107 |

2001/0004227 A1  6/2001  Frech et al.

FOREIGN PATENT DOCUMENTS

| | | |
|---|---|---|
| JP | 05-308229 | 11/1993 |
| JP | 07-066659 | 3/1995 |

OTHER PUBLICATIONS

" A Noise Optimization Technique for INtegrated Low-Noise Amplifiers", IEEE Journal of Solid State Circuits, vol. 37, No. 8, Aug. 2002, pp. 994-1002.

"Noise Figure and Impedance Matching in RF Cascode Amplifiers", IEEE Transactions on Circuits and Systems II: Analog and Digital Signal Processing, vol. 46, No. 11, Nov. 1999, pp. 1388-1396.

"A 1.8-V Wide-Band CMOS SNA for Multiband Multistandard Front-End Receiver", European Solid-State Circuits, Sep. 2003, pp. 141-144.

(Continued)

*Primary Examiner*—Robert Pascal
*Assistant Examiner*—Hieu Nguyen
(74) *Attorney, Agent, or Firm*—Blakely, Sokoloff, Taylor & Zafman

(57) ABSTRACT

Provided is a low noise amplifier with a common source and a source degeneration, which has linearity, power gain, noise factor, and lossless input matching. The low noise amplifier includes: a first inductor having one terminal connected to an input terminal receiving a signal; a second inductor having one terminal connected to a ground; a MOS transistor having a gate connected to the first inductor, a source connected to the other terminal of the second inductor, and a drain transmitting a signal; and a variable capacitor connected between the source and gate of the MOS transistor and varying an input matching frequency at the input terminal.

9 Claims, 6 Drawing Sheets

OTHER PUBLICATIONS

"An Ultrawideband CMOS Low-Noise Amplifier for 3.1-10.6-GHz Wireless Receivers" by Andrea Bevilacqua et al.; *IEEE Journal of Solid-State Circuits*; vol. 39, No. 12; Dec. 2004; pp. 2259-2268.
"An Ultrawideband CMOS Low-Noise Amplifier for 3.1-10.6-GHz Wireless Receivers" by Andrea Bevilacqua et al.; *IEEE Xplore*—a captured copy of a web page showing publication before filing application.
"Design Criteria for Tunable Matching Networks A MEMS Perspective in the FM Band" by Amro M. Elshurafa et al.; *IEEE* 2004; pp. 1311-1314.

* cited by examiner

LOW NOISE AMPLIFIER FOR WIDEBAND TUNABLE MATCHING

FIELD OF THE INVENTION

The present invention relates to a low noise amplifier with a common source and a source degeneration, which has linearity, high power gain, low noise factor, and lossless input matching.

DESCRIPTION OF RELATED ART

In a wideband or multiple band system, blocks for signal bands are implemented in parallel and are configured to maximally share the multiple bands.

As the signal band to be processed become wide and multiple bands, the number of the blocks increases in parallel. Accordingly, the integration of the system is difficult and the complexity and power consumption also increase.

FIG. 1 is a circuit diagram of a conventional low noise amplifier having a common gate structure for tunable matching.

Referring to FIG. 1, the conventional low noise amplifier performs a resistance matching using 1/gm of an input MOS transistor MN1 and includes a resonator circuit ($L_{T2}$ and $C_{V2}$) between a source of the MOS transistor MN1 and a ground, such that only desired RF signals are transmitted.

Accordingly, the low noise amplifier has a simple structure and has great advantage only in terms of the matching.

In the RF communication system, however, the low noise amplifier having the common gate structure is not used widely because its efficiency is bad in terms of power gain, power consumption, and noise factor.

FIG. 2 is a block diagram of a conventional low noise amplifier having an inductively degenerated common source structure.

The low noise amplifier having the inductively degenerated common source structure is widely used in the RF common system and has advantages in power gain, power consumption and noise factor, compared with the low noise amplifier shown in FIG. 1.

In the low noise amplifier shown in FIG. 2, an equivalent resistance looked from an input terminal is equal to gm*Ls/Cs, where gm is a trans-conductance of a MOS transistor MN1, Ls is an inductance between a source of the MOS transistor MN1 and a ground, and Cs is a parasitic capacitor (not shown) between the source and gate of the MOS transistor MN1.

A resonance frequency can be changed by adjusting the size of the parasitic capacitor Cs between the gate and source of the MOS transistor MN1, or by varying the inductance Lg or Ls.

Accordingly, although the low noise amplifier shown in FIG. 2 has advantages in power gain, power consumption and noise factor, it must be re-designed to adjust the capacitance of the parasitic capacitor Cs or the inductance Lg or Ls so as to change the frequency.

Also, due to the parasitic capacitor component generated at the input terminal of the low noise amplifier, the input matching value may be changed differently from the design value.

SUMMARY OF THE INVENTION

It is, therefore, an object of the present invention to provide a low noise amplifier having a common source and source degeneration and a wideband tunable matching frequency band with an optimized performance.

In accordance with an aspect of the present invention, there is provided a low noise amplifier having a common source and source degeneration structure, the low noise amplifier including: a first inductor having one terminal connected to an input terminal receiving a signal; a second inductor having one terminal connected to a ground; a MOS transistor having a gate connected to the first inductor, a source connected to the other terminal of the second inductor, and a drain transmitting a signal; and a variable capacitor connected between the source and gate of the MOS transistor and varying an input matching frequency at the input terminal.

In accordance with another aspect of the present invention, there is provided a low noise amplifier including: a first inductor having one terminal connected to an input terminal receiving a signal; a second inductor having one terminal connected to a ground; a MOS transistor having a gate connected to the first inductor, a source connected to the other terminal of the second inductor, and a drain transmitting a signal; a variable capacitor connected between the source and gate of the MOS transistor and varying an input matching frequency at the input terminal; and a shunt inductor connected to the gate of the MOS transistor, the shunt inductor being resonated with a parasitic capacitor generated at the gate of the MOS transistor in association with a parasitic inductance generated at the gate of the MOS transistor.

In accordance with a further another aspect of the present invention, there is provided a low noise amplifier including: a first inductor having one terminal connected to an input terminal receiving a signal; a second inductor having one terminal connected to a ground; a MOS transistor having a gate connected to the first inductor, a source connected to the other terminal of the second inductor, and a drain transmitting a signal; a variable capacitor connected between the source and gate of the MOS transistor and varying an input matching frequency at the input terminal; and a shunt capacitor connected to the input terminal, the shunt capacitor being resonated with a parasitic inductance component applied to the gate of the MOS transistor in association with a parasitic capacitance generated at a gate of the MOS transistor.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
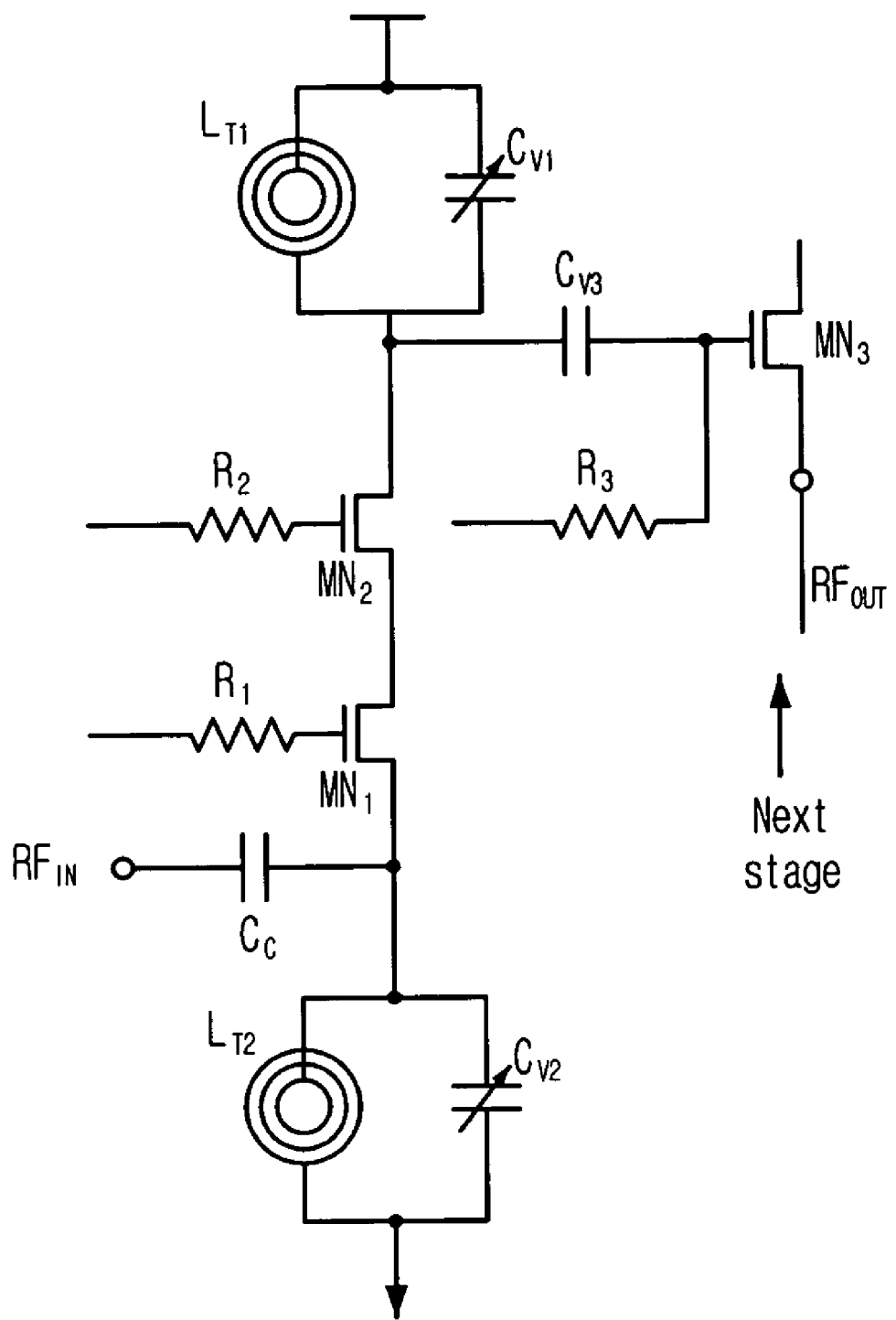
FIG. 1 is a circuit diagram of a conventional low noise amplifier having a common gate structure for a tunable matching.
Figure 2:
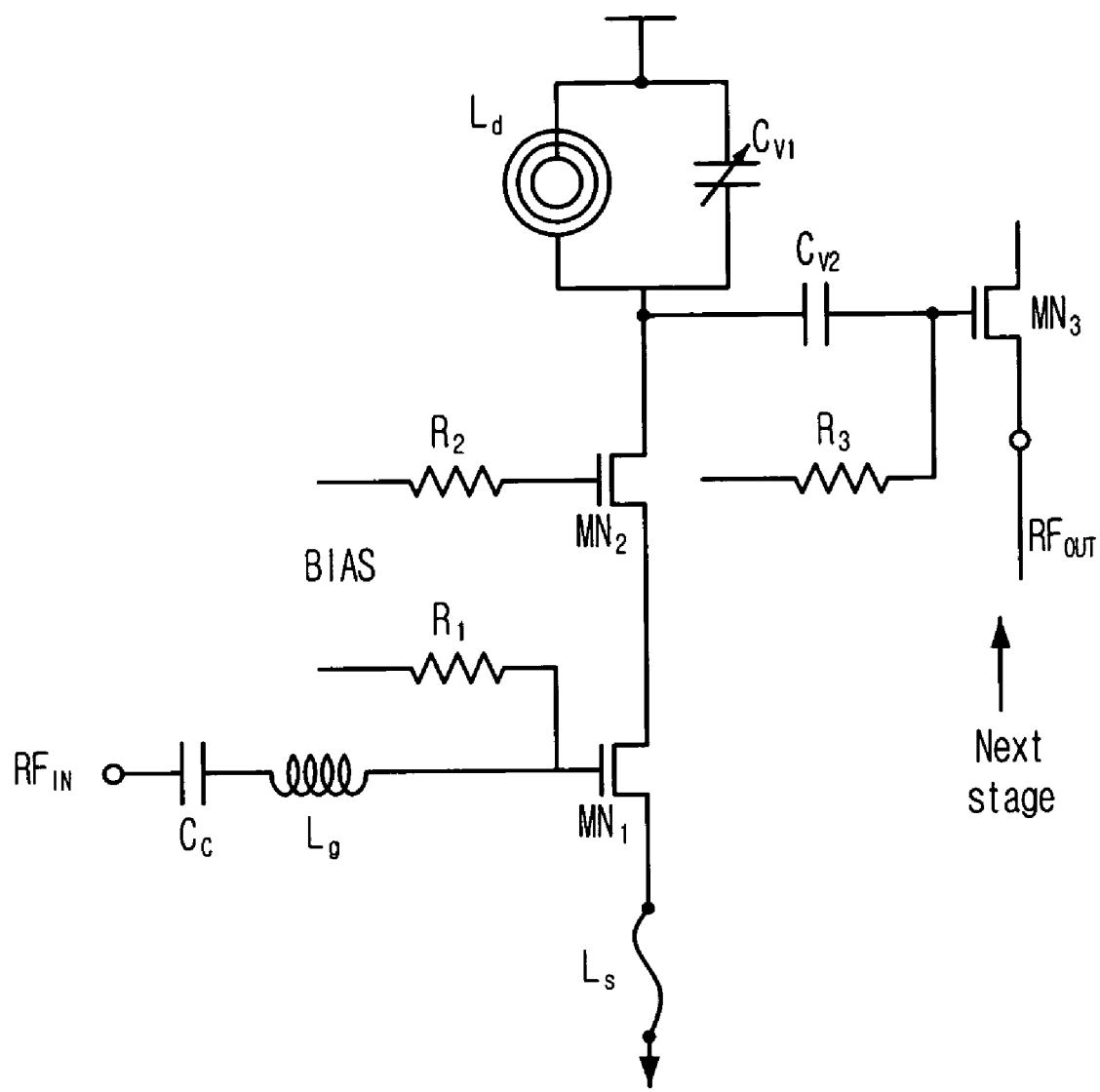
FIG. 2 is a circuit diagram of a conventional low noise amplifier having an inductively degenerated common source structure.
Figure 3:
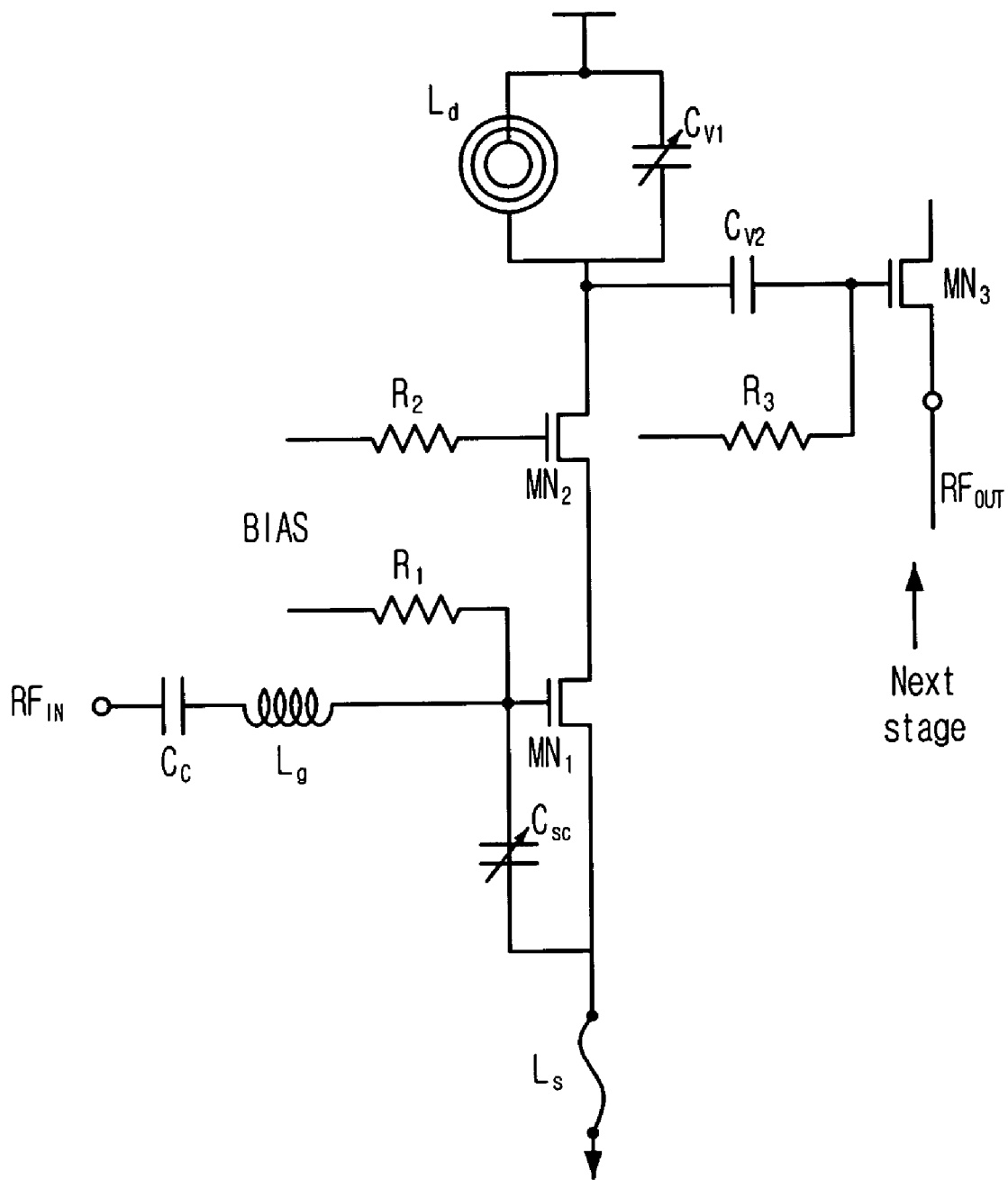
FIG. 3 is a circuit diagram of a low noise amplifier having an inductively degenerated common source structure in accordance with a first embodiment of the present invention.

FIG. 3 is a circuit diagram of a low noise amplifier having an inductively degenerated common source structure in accordance with a first embodiment of the present invention.

Referring to FIG. 3, the low noise amplifier includes an inductor $L_g$, a MOS transistor $MN_1$, and a variable capacitor $C_{sc}$. The inductor $L_g$ has one terminal connected to an input terminal receiving a signal $RF_{in}$ and the other terminal connected to a ground. The MOS transistor $MN_1$ has a gate connected to the inductor $L_g$, a source connected to an inductor $L_s$, and a drain transmitting a signal. The variable capacitor $C_{sc}$ is connected between the source and gate of the MOS transistor $MN_1$ and changes an input matching frequency of the input terminal.

A capacitor $C_c$ is provided for removing a DC component transmitted through the input terminal. A resistor $R_1$ is provided for biasing the gate of the MOS transistor MN1.

The variable capacitor $C_{sc}$ may be a capacitor that is continuously varied in response to a control signal. Also, the variable capacitor $C_{sc}$ may be a capacitor that has a plurality of parallel-connected switches responsive to a control signal and a plurality of unit capacitors connected to the corresponding switches, and also provides arbitrary different discontinuous capacitances (refer to FIG. 4).

Figure 4:
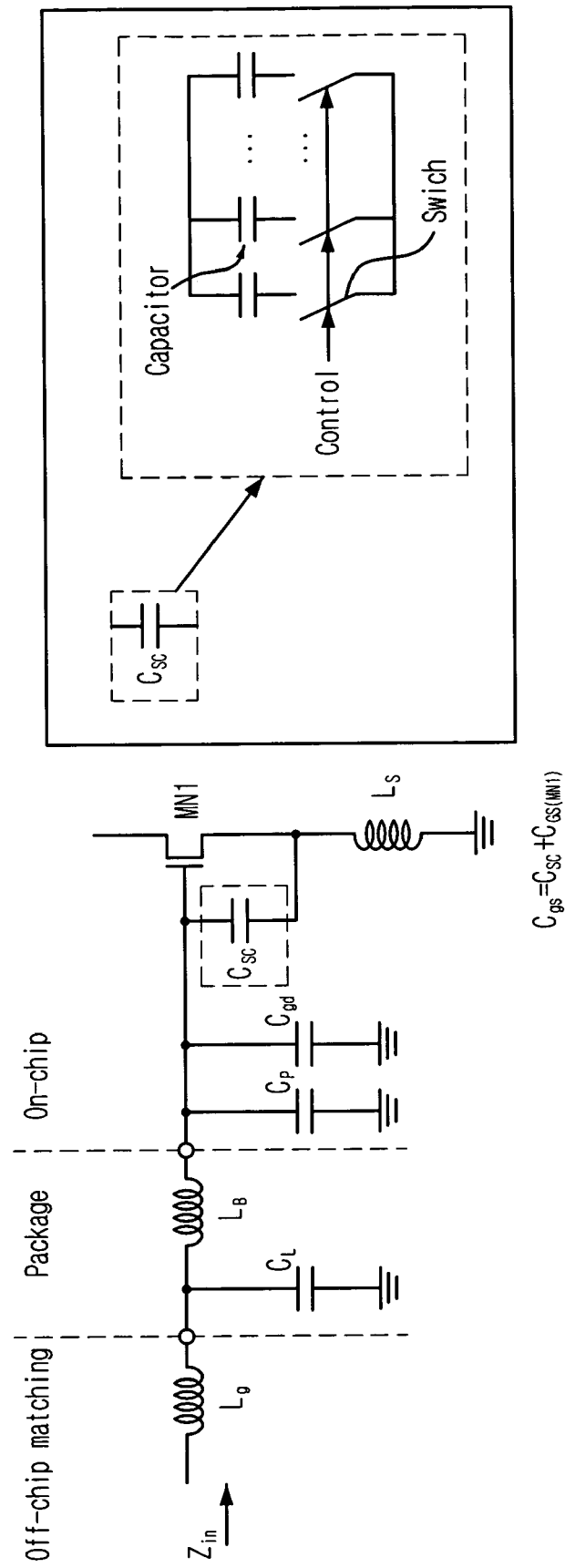
FIG. 4 is an equivalent circuit diagram for explaining an operation of the low noise amplifier shown in FIG. 3.

FIG. 4 is an equivalent circuit diagram for explaining an operation of the low noise amplifier shown in FIG. 3.

Hereinafter, the operation of the low noise amplifier in accordance with the present invention will be described in detail with reference to FIGS. 3 and 4.

When a signal of a specific frequency band is amplified, the low noise amplifier changes an impedance matching frequency by varying a resonance frequency.

It is very important to find a method that is optimized so as not to reduce the performance of the existing low noise amplifier by using a new function of varying the matching frequency. In this embodiment, the low noise amplifier varies the matching frequency by using the variable capacitor $C_{sc}$ for varying the capacitance between the gate and source of the MOS transistor $MN_1$ receiving the input signal.

The circuit diagram shown in FIG. 4 illustrates a simplified input terminal so as to analyze the parasitic effect at the input terminal of the low noise amplifier.

In FIG. 4, $L_g$ represents an inductance for the input matching, and $C_L$ represents a parasitic capacitance of a package and occupies a relatively large portion of the parasitic component. $L_B$, $C_P$ and $L_S$ represent a parasitic inductance of a bonding wire, a parasitic capacitance corresponding to a pad of an integrated circuit, and a degeneration inductance for the input matching, respectively.

Also, $C_{gs}$ is equal to $C_{SC}+C_{GS}$, where $C_{GS}$ is a capacitance between the gate and source of the MOS transistor $MN_1$ and $C_{SC}$ is a variable capacitor connected between the gate and source of the MOS transistor so as to vary the resonance frequency and receiving a frequency variable control signal. Further, a capacitor $C_{gd}$ is a capacitor representing a Miller's effect.

As described above, the variable capacitance $C_{SC}$ may be a capacitor having continuously variable capacitance or a capacitor having arbitrary discontinuous capacitance.

In order to maintain signal linearity and provide arbitrary discrete frequency tuning, the latter case is designed with a switched capacitor array that is switched on/off by switches. At this time, the switches are connected in parallel as shown in FIG. 4.

If the capacitance of $C_L+C_P$ exists within the variable range of the capacitance $C_{gs}$, the changing rate of the input resistance can be made small.

Figure 6:
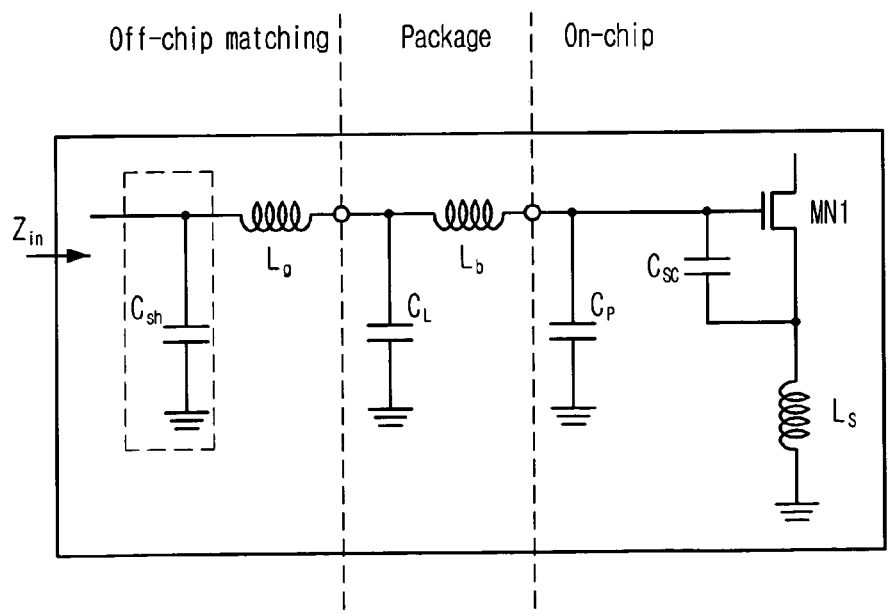
FIG. 6 is a circuit diagram of a low noise amplifier having an inductively degenerated common source structure in accordance with a third embodiment of the present invention.

The operation of the low noise amplifier shown in FIG. 4 will be described using Equations. Here, the capacitor $C_{gs}$ due to the Miller's effect will be omitted. A smith chart shown in FIG. 6 is made considering the effect of the capacitor $C_{gs}$.

First, the following Equations are presumed by Equation 1 below.

$$C_{gs}L_s, C_L L_b \ll L_g(C_L+C_P+C_{gs})\omega^2 g_m^2 L_s^2 C_P,$$
$$\omega^2 g_m^2 L_s^2 C_L \ll 1 \quad \text{(Equation 1)}$$

Accordingly, the resistance $R_{in}$ and an input resonance frequency $\omega_0$ at the input terminal of FIG. 4 are given as Equations 2 and 3 below.

$$R_{in} \approx \frac{\omega_T L_s}{\left(1+\frac{C_L+C_P}{C_{gs}}\right)^2} \quad \text{(Equation 2)}$$

$$\omega_0 \approx \frac{1}{\sqrt{L_g \cdot (C_L+C_P+C_{GS}+C_{SC})}} \quad \text{(Equation 3)}$$

$$\omega_T \approx \frac{3 \cdot \mu_n (V_{gs}-V_t)}{2 \cdot L^2 \cdot (1+C_{SC}/C_{GS})} \quad \text{(Equation 4)}$$

where $w_t$ is a unit gain angle frequency of a transistor. The unit gain angle frequency represents a gain characteristic of a frequency band. As the unit gain angle frequency is larger, a higher frequency can be used and a higher gain can be obtained.

It can be seen from Equations 2 and 3 that the input resistance $R_{in}$ is reduced when the parasitic capacitance of $C_L+C_P$ exists rather than when the parasitic capacitance of $C_L+C_P$ does not exist.

This problem becomes more serious as the resonance frequency is higher.

It can be seen from Equation 4 that $\omega_T$ is reduced by $C_{SC}/C_{GS}$ in association with the variation of the resonance frequency.

In association with the variation of the resonance frequency, the varied value of the input resistance for the variable capacitor is expressed as Equation 5 below.

$$\frac{\partial R_{in}}{\partial C_{gs}} = g_m \cdot L_s \cdot \frac{(C_P+C_L-c_{gs})}{(C_P+C_L+C_{gs})^3} \quad \text{(Equation 5)}$$

It can be seen from Equation 5 that the parasitic capacitance $C_P$ and $C_L$ can reduce the changing rate of the resistor with respect to the variation of the variable input capacitor $C_{gs}$. Specifically, when the parasitic capacitance component is equal to $C_{gs}$, the changing rate of the resistor becomes zero.

Meanwhile, the input resistance derived from a theoretical input matching when the parasitic component is not considered is constantly changed like Equation 6.

$$\partial Rin/\partial C_{gs} = -g_m \cdot L_s/C_{gs}^2 \quad \text{(Equation 6)}$$

Accordingly, when the parasitic capacitance $C_P$ and $C_L$ is equivalently removed, the variation characteristic of the impedance matching frequency and the inherent amplifier characteristic can be improved.

Figure 5:
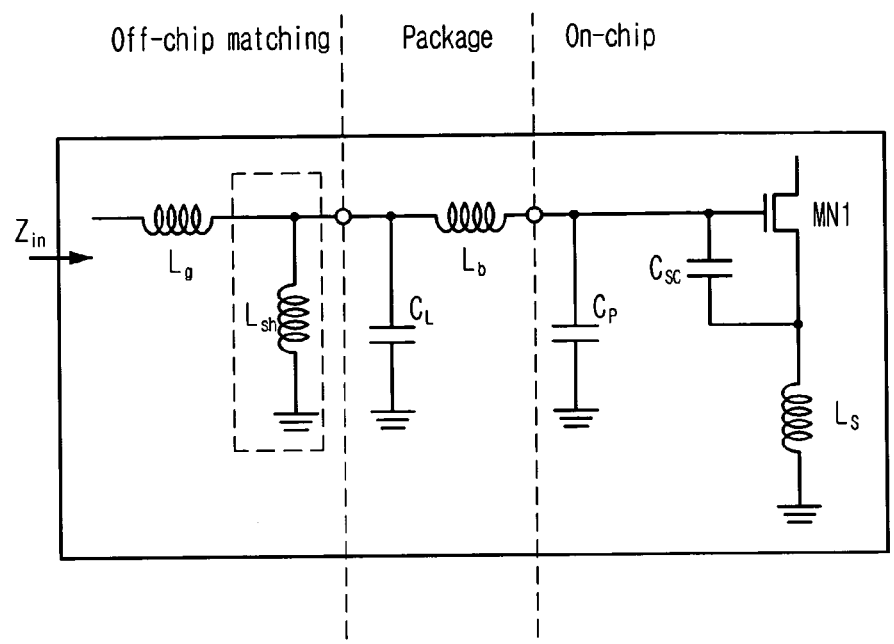
FIG. 5 is a circuit diagram of a low noise amplifier having an inductively degenerated common source structure in accordance with a second embodiment of the present invention.

Two methods for equivalently removing the parasitic capacitance are proposed in FIGS. 5 and 6.

FIG. 5 is a circuit diagram of a low noise amplifier having an inductively degenerated common source structure in accordance with a second embodiment of the present invention. In FIG. 5, the parasitic capacitance applied at the input terminal of the low noise amplifier is equivalently removed using a shunt inductor $L_{sh}$.

Referring to FIG. 5, the low noise amplifier includes an inductor $L_g$, an inductor $L_s$, a MOS transistor $MN_1$, a variable capacitor $C_{SC}$, and a shunt inductor $L_{sh}$. The inductor $L_g$ has one terminal connected to an input terminal receiving a signal. The inductor $L_s$ has one terminal connected to a ground. The MOS transistor $MN_1$ has a gate connected to the inductor $L_g$, a source connected to the other terminal of the inductor $L_s$, and a drain transmitting a signal. The variable capacitor $C_{SC}$ is connected between the source and gate of the MOS transistor $MN_1$ so as to vary the input impedance at the input terminal. The shunt inductor $L_{sh}$ is connected between the gate of the MOS transistor $MN_1$ and the ground and is resonated with the parasitic capacitors $C_L$ and $C_P$ generated at the gate of the MOS transistor $MN_1$ in association with the inductances $L_b$ and $L_g$ generated at the gate of the MOS transistor $MN_1$.

An operation of the low noise amplifier in accordance with the second embodiment of the present invention will be described with reference to FIG. 5.

Unlike the first embodiment shown in FIG. 3, the low noise amplifier of the second embodiment shown in FIG. 5 further includes the shunt inductor $L_{sh}$.

The input resistance when no parasitic capacitors $C_L$ and $C_P$ exist is $(g_m*L_s)/C_{gs}$ that represents a value when the impedance is matched. Compared with the case where no parasitic capacitance exists, the input resistance when the parasitic capacitance exists is reduced more than the resistance when the impedance is matched.

Due to the parasitic component generated at the input terminal of the conventional low noise amplifier, a larger amount of the current flows more than the desired amount or the inductance of the inductor $L_s$ increases. Accordingly, the input resistance decreases, thereby reducing the power gain and increase the noise factor at an overall performance.

In this embodiment, however, the shunt inductor $L_{sh}$ is resonated at the frequency of signal band where the parasitic capacitances $C_L$ and $C_P$ operate. Therefore, it does not appear at the input terminal at the desired RF signal band. That is, the resistance in the input matching returns to $(g_m*L_s)/C_{gs}$.

Further, the shunt inductor $L_{sh}$ functions to again move the resistances of the reduced signal frequency band (that is, the frequency band disposed near the matching point when no parasitic capacitance exists) to the matching point looked at the input terminal by the parasitic capacitance.

That is, when the parasitic capacitance for the variation of $C_{gs}(=C_{SC}+C_{GS})$ exists, the resistance changing rate moves. Therefore, a small change in the input resistance can be obtained with respect to a wide frequency variation.

In a single-ended low noise amplifier when the shunt inductor $L_{sh}$ is actually implemented, the shunt inductor $L_{sh}$ must be serially connected to a large capacitor so as to block DC components.

Also, in the case of the low noise amplifier receiving differential inputs, two input terminals are connected together and shunt inductors $L_{sh}$ are connected two times as many as the previous case where one input terminal exists.

FIG. 6 is a circuit diagram of a low noise amplifier having an inductively degenerated common source structure in accordance with a third embodiment of the present invention. In FIG. 6, the parasitic capacitance applied at the input terminal of the low noise amplifier is removed using a shunt capacitor $C_{sh}$.

Referring to FIG. 6, the low noise amplifier includes an inductor $L_g$, an inductor $L_s$, a MOS transistor $MN_1$, a variable capacitor $C_{SC}$, and a shunt capacitor $C_{sh}$. The inductor $L_g$ has one terminal connected to an input terminal receiving a signal. The inductor $L_s$ has one terminal connected to a ground. The MOS transistor $MN_1$ has a gate connected to the inductor $L_g$, a source connected to the other terminal of the inductor $L_s$, and a drain transmitting a signal. The variable capacitor $C_{SC}$ is connected between the source and gate of the MOS transistor $MN_1$ so as to vary the input impedance at the input terminal. The shunt capacitor $C_{sh}$ is connected between the input terminal and the ground and is resonated with the inductance component $L_g$ applied to the gate of the MOS transistor $MN_1$ in association with the parasitic capacitances $C_L$ and $C_P$ generated at the gate of the MOS transistor $MN_1$.

In accordance with the third embodiment of the present invention, the shunt capacitor $C_{sh}$ is resonated with the inductor $L_g$ serially connected to the parasitic components (the parasitic capacitance components $C_L$ and $C_P$ and the parasitic inductance component $L_b$), the matching point moved by the parasitic components of the input terminal again moves to the original matching point (for example, 50 ohms). Also, the frequency can be tuned in wideband and the input resistance changing rate in the frequency varying band becomes small, thereby obtaining the improved performance.

Also, in the case of the low noise amplifier receiving differential inputs, two input terminals are connected together and shunt capacitor $C_{sh}$ are connected two times as many as the previous case where one input terminal exists.

Figure 7:
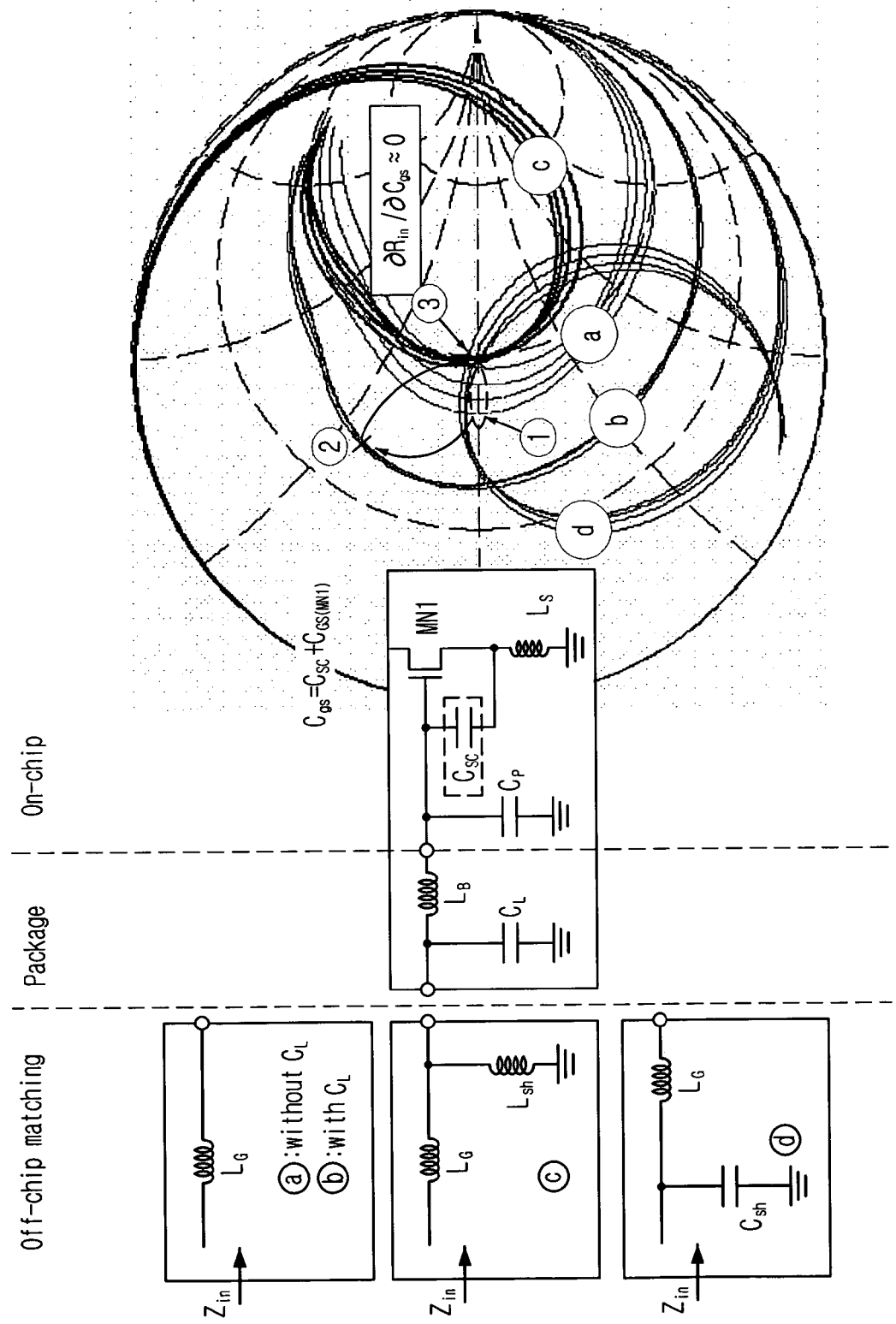
FIG. 7 is a smith chart for explaining an operation of the low noise amplifier in accordance with the present invention.

FIG. 7 is a smith chart for explaining the operation of the low noise amplifier in accordance with the present invention. In FIG. 7, the input matching circuit and its simulation result are shown.

The case of ⓐ in FIG. 7 is a simulation result when the capacitor $C_{gs}$ is varied after the matching performed in a state that the main parasitic component $C_L$ does not exist. It can be seen that the input resistance is greatly changed according to the variation of the capacitor $C_{gs}$.

The case of ⓑ in FIG. 7 is a simulation result when the main parasitic component is considered. However, the change of the input resistance is also reduced greatly with respect to the variation of the capacitor Cgs.

The path from ① to ② explains the effect of the parasitic capacitance. That is, the parasitic capacitance makes the movement from ① where no parasitic capacitance exists to ② where the parasitic capacitance is considered.

The cases of ⓒ and ⓓ in FIG. 7 are simulation results of the shunt inductor $L_{sh}$ and the shunt capacitance $C_{sh}$ for the input matching circuit in accordance with the present invention.

In the case of ⓒ, the shunt inductor $L_{sh}$ moves the matching point moved by the parasitic component to the original matching point such as the case of ⓐ. In this case, while the frequency band again moves to the matching point, the input resistance changes very slightly with respect to the variation of the capacitor Cgs. The path from ② to ③ explains the simulation result of the shunt inductor $L_{sh}$.

The case of ⓓ is the simulation result of the shunt capacitor $C_{sh}$. In this case, the matching point also returns to the original matching point due to the parasitic component. The advantages of the inventive wideband matching circuit are well shown in the simulation result of ⓒ and ⓓ.

These advantages are as follows.

First, the matching point moved by the parasitic component can return to the original matching point.

Second, the matching can be achieved without changing design parameters such as gm or $L_s$ of the circuit. Also, high gain and low noise figure can be obtained.

If the shunt inductor $L_{sh}$ and the shunt capacitance $C_{sh}$ are not used, gm or $L_s$ of the MOS transistor must be adjusted. However, the present invention need not adjust them.

Also, in the system of 2 GHz or higher, the use of gm or $L_s$ alone is difficult to restore the matching point moved by the parasitic component. Therefore, there is a special method that can prevent degradation of gain or noise figure.

Third, a wideband tunable frequency can be obtained. Since the parasitic capacitance reduces the tunable capacitance range with respect to the signal frequencies, the wideband tunable characteristic is degraded. However, in the inventive low noise amplifier, the parasitic capacitance does not appear equivalently, thereby obtaining a wideband tunable characteristic in the resonance frequency.

Fourth, since the wideband matching method and its principle are simple, it can be easily applied to the products.

In the low noise amplifier with the common source and source degeneration, which has linearity, power gain, noise factor and lossless input matching, the impedance matching frequency for signal processing of wideband or multiple frequency bands can be tunable.

Accordingly, the signal of the wideband or multiple bands can be processed more stably in the next-generation wireless communication systems.

The present application contains subject matter related to Korean patent application No. 2004-0109407, filed with the Korean Intellectual Property Office on Dec. 21, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A low noise amplifier having a common source and source degeneration structure, the low noise amplifier comprising:
   a first inductor having one terminal connected to an input terminal receiving a signal; a second inductor having one terminal connected to a ground;
   a MOS transistor having a gate connected to the first inductor, a source connected to the other terminal of the second inductor, and a drain transmitting a signal;
   a variable capacitor connected between the source and gate of the MOS transistor and varying an input matching frequency at the input terminal, wherein a tunable range of the variable capacitor is equal to or greater than a sum of a parasitic capacitance generated at a pad of an integrated circuit connected to the input terminal and a parasitic capacitance generated at a package; and
   a shunt inductor connected between the gate of the MOS transistor and the ground.

2. The low noise amplifier as recited in claim 1, wherein the variable capacitance is continuously varied in response to a control signal.

3. The low noise amplifier as recited in claim 1, wherein the variable capacitor includes:
   a plurality of switches connected in parallel and switched in response to a control signal; and
   a plurality of unit capacitors connected to the corresponding switches.

4. The low noise amplifier as recited in claim 1, wherein the shunt inductor being resonated with a parasitic capacitor capacitance generated at the gate of the MOS transistor in association with a parasitic inductance generated at the gate of the MOS transistor.

5. The low noise amplifier as recited in claim 4, further comprising a capacitor connected between the shunt inductor and the ground.

6. The low noise amplifier as recited in claim 5, further comprising:
   a third inductor having one terminal connected to a negative input terminal receiving a signal;
   a fourth inductor having one terminal connected to the ground;
   a differential-input MOS transistor having a gate connected to the third inductor, a source connected to the other terminal of the fourth inductor, and a drain transmitting a signal; and
   a differential-input variable capacitor connected between the source and gate of the differential-input MOS transistor so as to vary the input matching frequency at the input terminal,
   wherein the shunt inductor is connected between the gate of the differential-input MOS transistor and the ground.

7. The low noise amplifier as recited in claim 1, further comprising a shunt capacitor connected to the input terminal, the shunt capacitor being resonated with a parasitic inductance component applied to the gate of the MOS transistor in association with a parasitic capacitance generated at a gate of the MOS transistor.

8. The low noise amplifier as recited in claim 7, wherein the shunt capacitor is connected between the input terminal and the ground.

9. The low noise amplifier as recited in claim 7, further comprising:
   a third inductor having one terminal connected to a negative input terminal receiving a signal;
   a fourth inductor having one terminal connected to the ground;
   a differential-input MOS transistor having a gate connected to the third inductor, a source connected to the other terminal of the fourth inductor, and a drain transmitting a signal; and
   a differential-input variable capacitor connected between the source and gate of the MOS transistor so as to vary the input matching frequency at the input terminal,
   wherein the shunt capacitor is connected between the input terminal and the ground.

* * * * *